(12) United States Patent
Sandhu

(10) Patent No.: US 7,087,119 B2
(45) Date of Patent: Aug. 8, 2006

(54) ATOMIC LAYER DEPOSITION WITH POINT OF USE GENERATED REACTIVE GAS SPECIES

(75) Inventor: Gurtej S. Sandhu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 110 days.

(21) Appl. No.: 10/697,511

(22) Filed: Oct. 30, 2003

(65) Prior Publication Data

US 2004/0083951 A1 May 6, 2004

Related U.S. Application Data

(62) Division of application No. 10/091,938, filed on Mar. 5, 2002, now Pat. No. 6,730,367.

(51) Int. Cl.
*C23C 16/455* (2006.01)
*C23C 16/00* (2006.01)
*C23C 16/52* (2006.01)
*H01L 21/306* (2006.01)

(52) U.S. Cl. ............... 118/715; 118/620; 118/665; 118/666; 118/692; 118/712; 118/713; 118/722; 118/724; 118/725; 156/345.25; 156/345.26; 156/345.27; 156/345.29; 156/345.33; 156/345.5; 156/345.51; 156/345.52; 156/345.53; 156/345.54

(58) Field of Classification Search ............ 118/58, 118/620, 665, 666, 692, 712, 713, 715, 722, 118/724, 725; 156/345.25, 345.26, 345.27, 156/345.29, 345.33, 345.5, 345.51, 345.52, 156/345.53, 345.54
See application file for complete search history.

(56) References Cited

U.S. PATENT DOCUMENTS

| | | | | |
|---|---|---|---|---|
| 4,176,024 A | * | 11/1979 | Garbuny | 204/157.22 |
| 4,260,649 A | | 4/1981 | Dension et al. | |
| 4,522,674 A | * | 6/1985 | Ninomiya et al. | 156/345.35 |
| 4,734,152 A | * | 3/1988 | Geis et al. | 216/45 |
| 4,774,416 A | * | 9/1988 | Askary et al. | 250/492.2 |
| 4,924,807 A | * | 5/1990 | Nakayama et al. | 118/725 |
| 4,975,252 A | * | 12/1990 | Nishizawa et al. | 118/688 |
| 5,023,424 A | | 6/1991 | Vaught | |
| 5,114,834 A | * | 5/1992 | Nachshon | 430/329 |
| 5,174,826 A | * | 12/1992 | Mannava et al. | 118/719 |

(Continued)

OTHER PUBLICATIONS

Vinay Prasad, Matthias K. Gobbert, and Timothy S. Cale, Prediction of Deposition Rates in Atomic Layer Deposition, Focus Center—New York, Rensselaer: Interconnections for Gigascale Integration, Rensselaer Polytechnic Institute, Troy, NY, Department of Mathematics and.

*Primary Examiner*—Jeffrie R. Lund
(74) *Attorney, Agent, or Firm*—Dinsmore & Shohl LLP

(57) ABSTRACT

An apparatus for atomic layer deposition preventing mixing of a precursor gas and an input gas. From the apparatus a flow of the input gas is provided over a surface of the workpiece wherein a beam of the electromagnetic radiation is directed into the input gas in close proximity to the surface of the workpiece, but spaced a finite distance therefrom. The input gas is dissociated by the beam producing a high flux point of use generated reactive gas species that reacts with a surface reactant formed on the surface of the workpiece by a direct flow of the precursor gas flown from the dispensing unit. The surface reactant and reactive gas species react to form a desired monolayer of a material on the surface of the workpiece.

17 Claims, 4 Drawing Sheets

U.S. PATENT DOCUMENTS

| | | | |
|---|---|---|---|
| 5,270,247 A * | 12/1993 | Sakuma et al. | 117/89 |
| 5,290,383 A * | 3/1994 | Koshimizu | 156/345.25 |
| 5,540,783 A * | 7/1996 | Eres et al. | 118/725 |
| 5,607,601 A | 3/1997 | Loper et al. | |
| 5,637,188 A * | 6/1997 | Amme et al. | 438/708 |
| 5,659,383 A | 8/1997 | Ozawa | |
| 5,669,979 A * | 9/1997 | Elliott et al. | 134/1 |
| 5,772,771 A * | 6/1998 | Li et al. | 118/723 I |
| 5,814,156 A * | 9/1998 | Elliott et al. | 134/1 |
| 6,136,719 A * | 10/2000 | Miller et al. | 438/707 |
| 6,200,389 B1 * | 3/2001 | Miller et al. | 118/729 |
| 6,203,865 B1 * | 3/2001 | Badzian et al. | 427/596 |
| 6,334,901 B1 * | 1/2002 | Nishizawa et al. | 118/725 |
| 6,416,823 B1 * | 7/2002 | Li et al. | 427/569 |
| 6,448,192 B1 | 9/2002 | Kaushik | |
| 6,461,436 B1 * | 10/2002 | Campbell et al. | 118/715 |
| 6,461,909 B1 | 10/2002 | Marsh et al. | |
| 6,503,330 B1 * | 1/2003 | Sneh et al. | 118/715 |
| 6,509,601 B1 | 1/2003 | Lee et al. | |
| 6,573,199 B1 * | 6/2003 | Sandhu et al. | 438/798 |
| 6,634,314 B1 * | 10/2003 | Hwang et al. | 118/723 R |
| 6,730,367 B1 * | 5/2004 | Sandhu | 427/553 |
| 6,793,736 B1 * | 9/2004 | Sandhu et al. | 134/1 |
| 6,821,563 B1 * | 11/2004 | Yudovsky | 427/248.1 |
| 2002/0031846 A1 * | 3/2002 | Natori | 438/2 |
| 2003/0102008 A1 * | 6/2003 | Sandhu et al. | 134/1.3 |
| 2003/0170389 A1 * | 9/2003 | Sandhu | 427/255.28 |
| 2004/0058293 A1 * | 3/2004 | Nguyen et al. | 432/129 |
| 2004/0083951 A1 * | 5/2004 | Sandhu | 118/58 |
| 2004/0129212 A1 * | 7/2004 | Gadgil et al. | 118/715 |
| 2004/0185184 A1 * | 9/2004 | Sandhu | 427/586 |

* cited by examiner

ATOMIC LAYER DEPOSITION WITH POINT OF USE GENERATED REACTIVE GAS SPECIES

CROSS REFERENCE TO RELATED APPLICATIONS

This application is a divisional of application Ser. No. 10/091,938, filed Mar. 5, 2002, now U.S. Pat. No. 6,730,367, which related to patent application Ser. No. 09/998073 for Q'A Method to Provide High Flux of Point of Use Activated Reactive Species for Semiconductor Processing," filed on Nov. 30, 2001, now U.S. Pat. No. 7,001,481.

BACKGROUND OF THE INVENTION

The invention pertains to semiconductor processing and in particular, to an improved atomic layer deposition apparatus using a point of use generated reactive gas species for semiconductor processing.

Atomic layer deposition (ALD), also known as atomic layer epitaxy (ALE) and atomic layer chemical vapor deposition (ALCVD), offers many advantages over the traditional deposition methods. ALD relies on self-limiting surface reactions in order to provide accurate thickness control, excellent conformality, and uniformity over large areas. As the microscopic features on a chip grow increasingly narrow and deep, these unique features make ALD one of the most promising deposition methods in the manufacturing of the future circuits.

The feature that makes ALD a unique deposition method compared to chemical vapor deposition (CVD) is that it deposits atoms or molecules on a wafer a single layer at a time. Additionally, ALD films are deposited at temperatures significantly lower than comparable CVD processes, thereby contributing to lower thermal exposure of the wafer during processing. Furthermore, as another distinction from CVD methods, no strict precursor flux homogeneity is required in ALD because of the self-limiting growth mechanism. The flux has only to be large enough to fully saturate the surface with the given reactant. This enables, for example, the utilization of low vapor pressure solids, which are difficult to be delivered at constant rates.

ALD accomplishes deposition by introducing gaseous precursors alternately onto a workpiece such as, for example, semiconductor substrate or wafer. Under properly adjusted processing conditions, i.e., deposition temperature, reactant dose, length of precursor, and purge pulses, a chemisorbed monolayer of a first reactant is left on the surface of the workpiece after a purge sequence. Typically, the purge sequence is completed by evacuating or purging the entire reactor chamber. Afterwards, the first reactant is reacted subsequently with a second reactant pulse, such as a flux of a generated reactive gas species, to form a monolayer of a desired material along with any gaseous reaction byproducts, such as when compounds are used as precursors. The surface reactions are self-controlled and produce no detrimental gas phase reactions, thereby enabling accurate control of film thickness by counting the number of deposition cycles.

In one particular ALD method, there is a high degree of interest in using a point of use generated reactive gas species. However, for ALD processes, it is difficult to generate a high flux of short-lived reactive gas species on the surface of the wafers and cycle it through a number of on/off states at a fast rate required for high throughput ALD processes.

SUMMARY OF THE INVENTION

The present invention solves the above-mentioned difficulties by providing an improved atomic layer deposition method and system. In particular, a dispenser unit according to the present invention is used with a point of use generated reactive gas species for atomic layer deposition, which permits the cycling of the system through a number of on/off states at a fast rate for higher processing throughput.

In a reaction chamber containing a workpiece, a precursor gas is flown directly onto an exposed surface of the workpiece from the dispenser unit to form a surface reactant thereon. Additionally, an input gas is flown in through a side of the dispenser unit. The flows of precursor and input gases are separated by a pump/purge setup on the dispenser unit designed to prevent mixing. As the workpiece is scanned under the dispenser unit to form the surface reactant, the input gas is exposed to a focused beam of electromagnetic radiation. The electromagnetic radiation dissociates a gaseous constituent of the input gas creating the high flux of point of use generated reactive gas species. The incoming flux of the generated reactive gas species reacts with the surface reactant in a complete and self-limiting reaction forming a desired monolayer of a material thereon. Multiple dispenser units can be used to increase the ALD process.

A system and apparatus for generating a high flux of short-lived activated reactive gas species using transmission gas (es) is disclosed by commonly assigned patent application: Ser. No. 09/998,073 for "A Method to Provide High Flux of Point of Use Activated Reactive Species for Semiconductor Processing," filed on Nov. 30, 2001, which is herein incorporated fully by reference.

In one aspect, the present invention encompasses a method of chemically treating a surface of a workpiece. The method comprises exposing the surface of the workpiece to a direct flow of a precursor gas to form a surface reactant thereon, and providing a flow of an input gas above the surface of the workpiece. The method further comprises preventing the mixture of the precursor gas and the input gas with a purge gas, directing a beam of electromagnetic radiation into the input gas to produce a high flux of generated reactive gas species, and reacting the generated reactive gas species with the surface reactant.

In another aspect, the present invention encompasses a system for chemically treating a surface of a workpiece. The system comprises a supply of an input gas, a supply of a precursor gas, and a supply of a purge gas. A dispenser unit is adapted to expose the surface of the workpiece to a direct flow of the precursor gas for a surface reactant formation, to provide a flow of the input over the workpiece, and to provide the purge gas between the precursor gas and the input gas to prevent mixing of the precursor and input gases. The dispenser unit further includes a pair of evacuation ports for evacuating the purge gas. A source is adapted to converge a beam of electromagnetic radiation in the flow of the input gas in close proximity to the surface of the workpiece, but spaced a finite distance therefrom, to dissociate the input gas into a high flux of generated reactive gas species that reacts with the surface reactant to chemically treat the surface of the workpiece.

In still another aspect, the present invention encompasses a dispenser unit adapted for use in a reaction chamber for atomic layer deposition of a material onto a surface of a workpiece. The dispenser unit comprises a first gas port adapted to provide a flow on an input gas over the surface of the workpiece to be dissociated by a radiation beam into a point of use generated reactive species. Further included is a second gas port adapted to provide a direct flow of a precursor gas onto the surface of the workpiece which by chemisorption forms a first surface reactant, and a third gas port adapted to flow a purge gas to prevent mixing of the input and precursor gases. Also provided is a pair of evacuation ports adapted to evacuation at least the purge gas.

These and other features and objects of the present invention will be apparent in light of the description of the invention embodied herein.

BRIEF DESCRIPTION OF THE DRAWINGS

The following detailed description of the embodiments of the present invention can be best understood when read in conjunction with the following drawings, where like structure is indicated with like reference numerals and in which.

DETAILED DESCRIPTION OF THE PREFERRED EMBODIMENTS

In the following detailed description that follows, reference is made to various specific embodiments in which the invention may be practiced. These embodiments are described in sufficient detail to enable those skilled in the art to practice the invention, and it is to be understood that other embodiments may be utilized and that specific equipment, processing steps, energy sources, and other changes may be made without departing from the spirit and scope of the present invention.

The term "workpiece" as used herein includes semiconductor substrate, printed circuits, and other structures that may be chemically treated by the method and system of the invention.

The terms "substrate" as used herein include any semiconductor-based or other structure having an exposed surface in which to form a structure using the system or method of this invention. Substrate is to be understood as including silicon-on-insulator, doped and undoped semiconductors, epitaxial layers of silicon supported by a base semiconductor foundation, and other semiconductor structures. Furthermore, when reference is made to a substrate in the following description, previous process steps may have been utilized to form active devices, regions or junctions in the base semiconductor structure or foundation.

Figure 1:
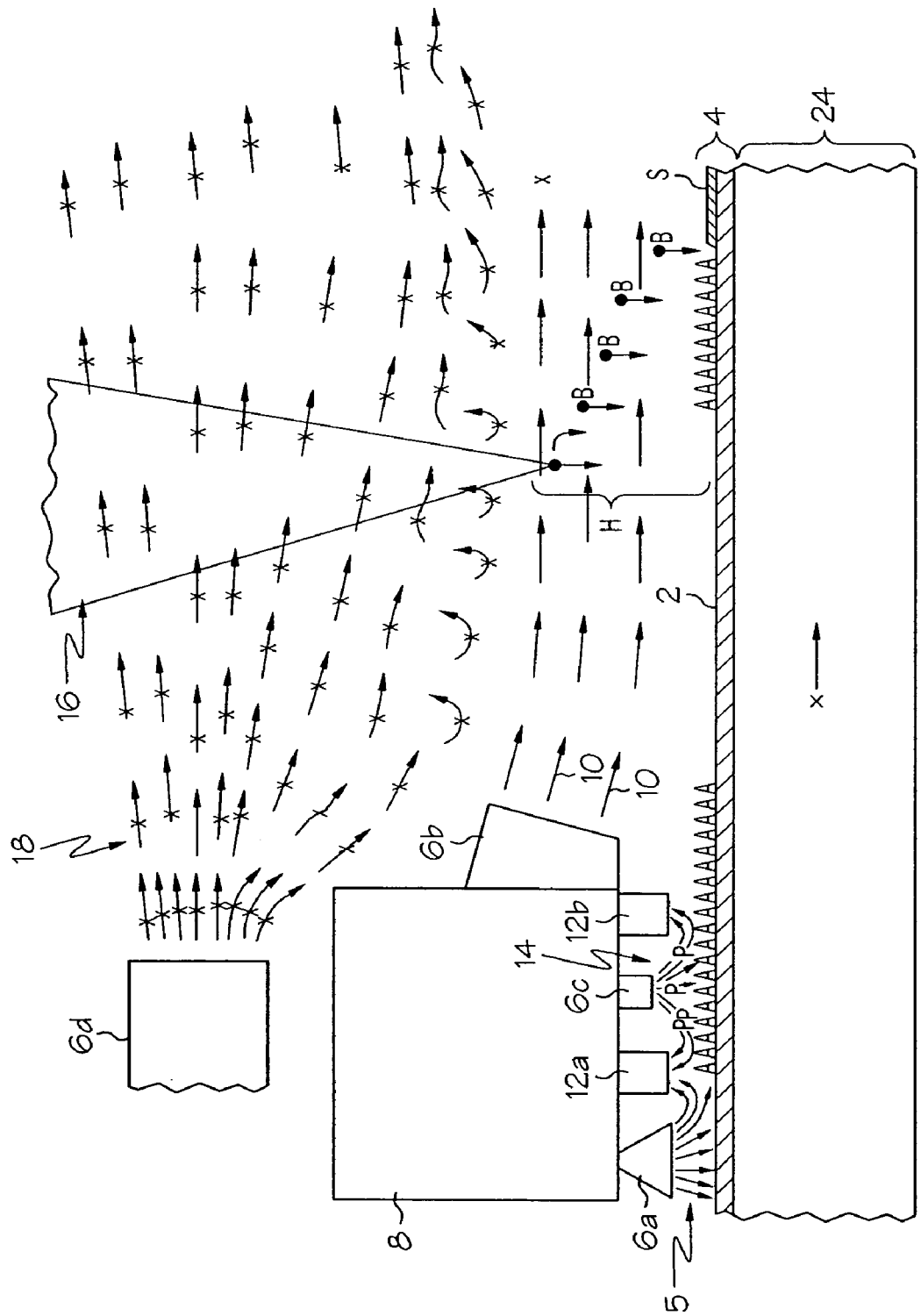
FIG. 1 is an enlarged cross sectional view of a workpiece during a chemical treatment procedure according to the present invention.

FIG. 1 discloses an improved atomic layer deposition method and apparatus according to the present invention providing a point of use generated/activated reactive gas species for processing a surface 2 of a workpiece 4. A first precursor gas, indicated by 5, is flown directly onto the surface 2 of the workpiece from a first gas port 6a of a dispenser unit 8. From a side of the dispenser unit 8, a flow of an input gas 10 is provided from a second gas port 6b in a direction away from the flow of the precursor gas 5.

Between the first and second gas ports 6a and 6b, the dispenser unit 8 further includes a pair of evacuation ports 12a and 12b, and a third gas port 6c. As illustrated, juxtaposed to the first evacuation port 12a are the first and third gas ports, 6a and 6c, and juxtaposed to the second evacuation port 12b are the second and third gas ports, 6b and 6c. The third gas port 6c is used to flow a purge gas, indicated by 14, directly onto the surface 2 of the workpiece.

In a purge/pump sequence, as the precursor gas 5, input gas 10, and purge gas 14 are flown from the dispenser unit 8, the pair of evacuation ports 12a and 12b pump out any residuals/gases in their general vicinity. By this arrangement, ports 6c and 12a–b on the dispenser unit 8 prevent the mixing of the precursor gas 5 and the input gas 10 by creating a pump/purge barrier therebetween.

During processing, ALD pulse lengths are determined by the space between the gas ports as well as a scan speed of workpiece. Accordingly, under properly adjusted processing conditions (i.e., deposition temperature, reactant dose, and length of precursor and purge gases pulses), scanning the workpiece 4 under the dispenser unit 8 in the direction indicated by "X", leaves a chemisorbed monolayer of a surface reactant, illustrated by symbols "A", on the surface 2 after the purge/pump sequence of the dispenser unit 8 with flows of the precursor gas 5 and purge gas 14.

While scanning the workpiece 4, a beam of electromagnetic radiation 16 is directed into the input gas 10 producing at the point of use a high flux of short-lived generated reactive gas species, illustrated by symbols "B", by dissociating a gaseous constituent of the input gas 10. As the reactive gas species B reaches the surface 2 of the workpiece 4, reactants A and B react together in a complete and self-limiting reaction which forms a desired monolayer of a material, illustrated by symbol S, on the surface 2 of the workpiece 4. Material monolayer S may be an element or a compound. Therefore, the above-described multi-port dispenser unit 8 permits at the same time the formation of both surface reactant A on a first portion of the surface 2 of the workpiece 4 and the desired material monolayer S on a subsequent surface portion of the workpiece.

The beam of electromagnetic radiation 16 may advantageously be provided as a converging laser beam. Additionally, to ensure that maximum energy is provided at the focal point of the laser beam, a transmission gas 18 that is substantially nonattenuating to preselected wavelengths of electromagnetic radiation may be provided by a fourth gas port 6d. Furthermore, the second gas port 6b may be a nozzle providing a laminar flow of the input gas 10 over the surface 2 of the workpiece 4 such that the beam 16 converges in the flow in close proximity to the surface of the workpiece, but spaced a finite distance therefrom. This finite distant is indicated by symbol "H." It is to be appreciated that the input gas is provided over the surface of the workpiece in a gas layer having a thickness that is at least large enough to accommodate the finite distance H.

It is to be appreciated that a laminar flow prevents the input gas from spiraling over the surface 2 of the workpiece 4, thereby minimizing non-uniform distribution of the generated reactive gas species B. Baffles may be incorporated into the nozzle 6b to break up the incoming gas stream into the desired laminar flow. Furthermore, the width of nozzle 6b can be made adjustable to optimize the gas flow rate for particular chemically treatments of the surface 2 of the workpiece 4.

With regard to distance H, the beam 16 is focused in proximity to the surface 2 of the workpiece 4 such that maximum beam energy dissociates at the point of use a gaseous constituent of the input gas 10 into the high flux of generated reactive gas species B. Preferably, distance H is less than a few mean-free-path lengths of the generated reactive gas species B, or from about 2 millimeters to about 4 millimeters above the surface 2 of the workpiece 4. At a distance from about 2 millimeters to about 4 millimeters, the generated flux of reactive gas species B is closes enough in order to migrate to the surface 2, yet far enough that the focal point of the laser beam 16 does not inadvertently impact the workpiece 4.

It is to be further appreciated that the laser beam 16 can dissociate more than one generated reactive gas species B depending on the composition of the input gas 10, and also depending on the particular wavelength(s) of electromagnetic radiation present in the laser beam 16. Therefore, besides reducing energy losses of the laser at its focal point, the present invention also gives access to new, quickly disappearing metastables that would otherwise disappear and never reach the surface 2 of the workpiece if formed well above the wafer surface. In the next sections, the above-described methodology and apparatus is further disclosed by the exemplary embodiments of a processing system 20 shown by FIGS. 2–4.

Figure 2:
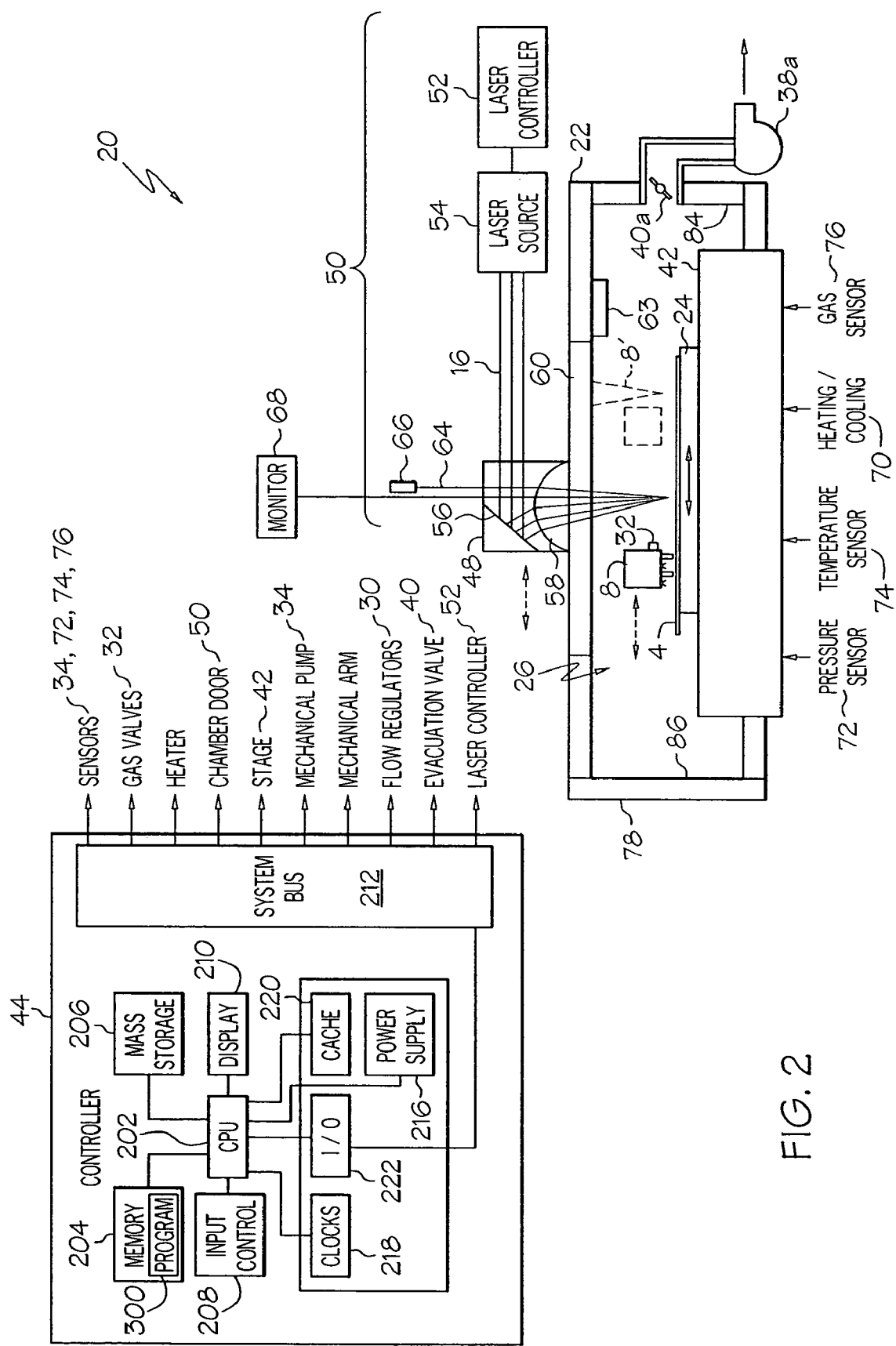
FIG. 2 is a diagrammatic side view of a structure adapted to chemically treat a surface of a workpiece according to the present invention.

FIG. 2 is a diagrammatic sectional side view of the major component parts of an exemplary embodiment of a processing system 20 having a chamber 22 for containing the workpiece 4 to be processed. In a typical example, the workpiece 4 comprises a semiconductor wafer of 1 to 8 inches in diameter and 0.127 to 0.89 mm thick, which is supported upon a conventional chuck 24.

Figure 3:
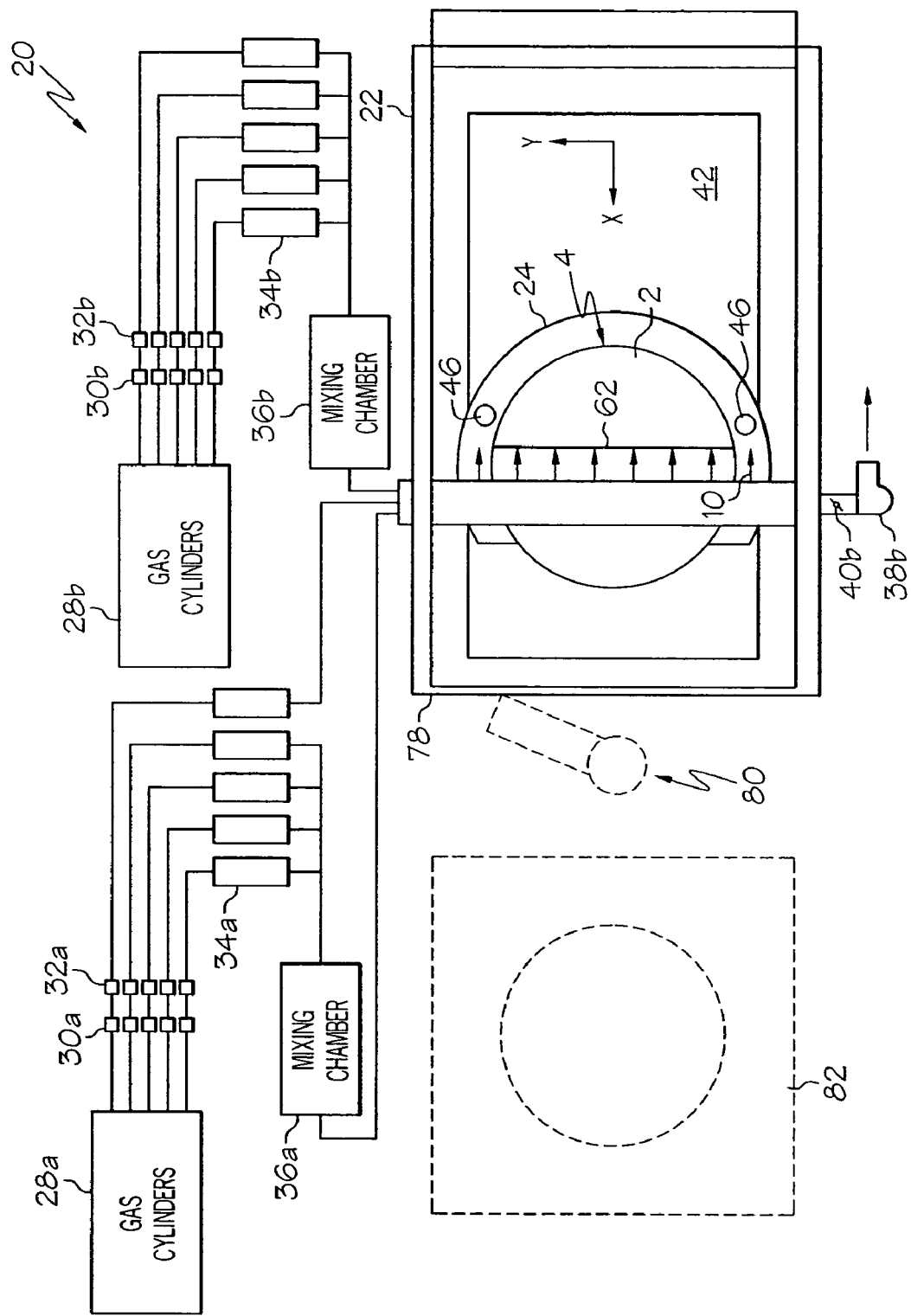
FIG. 3 is a diagrammatic top view of a structure adapted to chemically treat a surface of a workpiece according to the present invention.

The chamber 22 is sealable such that it may contain and hold a subambient pressure of from about 0.1 Torr to about 100 Torr of a gaseous atmosphere, generally indicated by 26, which is supplied to the chamber from first and second gas sources 28a and 28b, respectively. As illustrated by FIG. 3, the first gas source 28a is in gas communication with the chamber 22, and provides the precursor and purge gases 5 and 14, and optionally, transmission gas 18. These gases each may be a single gas or a mixture of such gasses.

The second gas source 28b is also in gas communication with the chamber 22 and provides the input gas 10. Gases 5, 10, 14 and/or 18 are regulated in a conventional manner, such as for example, in-line pressure regulators 30a and 30b, values 32a and 32b, and mass flow meters 34a and 34b. When introducing mixtures of gases in the chamber 22, including other conditioning gas/gases to aid and/or inhibit such chemical processes, conventional mixing chambers 36a and 36b may be used, if desired, to homogenize the gaseous mixture(s).

After completion of the ALD processes, the gaseous atmosphere 26 within the chamber 22 may be quickly evacuated by a first mechanical exhaust pump 38a connected also in gas communication with the chamber via a first exhaust valve 40a. However, it is to be appreciated that unlike prior art type chambers, the entire gaseous atmosphere 26 within the chamber 22 does not need to be purge or exhausted between pulse phases of the ALD process due to the purge/pump set-up of the dispenser unit 8 provided therein. As illustrated by FIG. 3, the pair of evacuation ports 12a and 12b of the dispenser units are in gas communication with a second mechanical exhaust pump 38b and regulated by a second exhaust valve 40b for the above purpose.

The input gas 10 is a gas or mixture of gases that absorb predetermined wavelengths of electromagnetic energy and dissociate to form the desired generated reactive gas species B. Such gases that include: $N_2O$, $NO_2$, $NH_3$, $H_2$, $H_2O$, $N_2$, $O_2$, $O_3$, $CCl_4$, $BCl_3$, $CDF_3$, $CF_4$, $SiH_4$, $CFCl_3$, $F_2CO$, $(FCO)_2$, $SF_5NF_2$, $N_2F_4$, $CF_3Br$, $CF_3NO$, $(CF_3)_2CO$, $CF_2HCl$, $CF_2HBr$, $CF_2Cl_2$, $CF_2Br_2$, $CF_2CFCl$, $CF_2CFH$, $CF_2CF_2CH_2$, $NH_3$, $CHF_3$, fluorohalides, halocarbons, and combinations thereof. Such desired reactive gas species B include: NO, OH, NH, N, F, $CF_3$, $CF_2$, CF, $NF_2$, NF, Cl, O, $BCl_2$, BCl, FCO, and combinations thereof. It is to be appreciated that the choice of input gas 10 employed in a photoreactive treatment procedure is guided by the type of chemically treatment process to be carried out.

The transmission gas 18, if used, is a gas or mixture of gases that is non-attenuating to predetermined wavelengths of electromagnetic radiation. Such transmission gasses, as well as the purge gas include argon, nitrogen, helium, neon, and combinations thereof.

Depending on the particular parameters used in the chamber 22, other conditioning gases may be used such as to absorb electromagnetic radiation, to reduce the concentration of an reactive gas species, or as a catalyst for the reaction between the reactive gas species B and the reactant(s), such as surface reactant A. As such, a conditioning gas may be employed for controlling the reaction rate between the reactive gas species B and reactant A, or for creating a minimum reaction energy threshold for limiting the production of undesirable reaction products (e.g., ozone and hazardous polymer-based reaction products).

Examples of conditioning gas molecules include nitrogen, helium and argon. Nitrogen acts mainly to impede the reaction between material deficient regions and reactant gases, while argon tends to impede the diffusion of the primary reactant gas molecules, rather than to participate in a reaction. Helium behaves in an intermediate manner between nitrogen and argon.

The chamber 22 also contains a translation stage 42 to support the workpiece 4 in the chuck 24 and to move it in and out of the chamber 22. The translation stage 42 is electrically driven, and moves the chuck 24 and workpiece 4 held thereon back and forth within the chamber 22 at a constant rate (e.g., about 6.5 mm/sec) specified by a controller 44. As best illustrated by FIG. 3, protruding banking pins 46 spaced by about 120 degrees hold the workpiece 4 in place on the chuck 24.

In one embodiment, the translation stage 42 causes relative motion between the surface 2 of the workpiece 4, the dispenser unit 8, and the beam 16 such that the precursor gas 5, purge gas 14, and beam 16 sweeps or scans over the surface 2 of the substrate 4 during processing. In another embodiment, the workpiece 4 may be held stationary during processing, and the dispenser unit 8 and scanning optics 48 of a laser system 50 are moved to cause the desired relative motion between the surface 2 of the workpiece 4, the dispenser unit 8, and the beam 16.

The laser beam 16 is shaped and delivered to the chamber 22 via the conventional laser system 50 that includes the scanning optics 48, a laser controller 52, and a laser source 54. In particular, the scanning optics 48 typically comprises one or more mirrors 56 (only one of which is shown) and focusing lenses 58. The mirrors 56 direct laser beam 16 towards the focusing lens 58 which shapes the conventional rectangular cross-section beam 16 received from the laser source 54 into a converging beam of electromagnetic energy proximate the surface 2 of the workpiece 4.

In one embodiment, the focusing lens 58 forms part of a window 60 of the chamber 22, such as in the embodiment when relative motion is provided between the laser beam 16 and workpiece 4 by the translation stage 42. In other embodiments, the scanning optics 48 along with the focusing lens 58 move relative to the window 60 to provide the desired scanning of the surface 2 of the workpiece 4 with beam 16. The windows 60 may be quartz, sapphire, or zinc selenide. In still other embodiments, the focusing lens 58 is a cylindrical refractive lens, and both the lens 58 and window 60 are made from fused silica which allows visual inspection of the chamber 22 during a photoreactive treatment procedure, which is useful for monitoring the progress of a reaction as well as for end-point detection.

Additionally, although laser beam 16 is illustrated as a long narrow band 62 that extends across the major expanse of the surface 2 of the workpiece 4 during processing, it is to be understood that laser beam 16 can comprise other shapes. For example, the beam 16 may be provided as a circular beam which traverses across an entirety of the surface 2 of the workpiece 4 along the shown X and Y axes. Alternatively, the beam 16 can be configured to be wide enough to cover an entirety of the surface 2 of the workpiece 4 without being passed across such surface.

Laser source 54 may be an excimer laser (for example, a Cymer CX-2 excimer laser available from Cymer Laser Technologies of San Diego, Calif., USA), which generates a pulsed beam 16 at wavelengths of 248 nm and 193 nm, and adapted to provide beam energy in the range of about 100 to about 5000 mJ/cm$^2$. Other lasers could be used, e.g., a tunable Alexandrite solid state pulsed laser in combination with a frequency multiplier. As shown in FIG. 2, the cross-sectional dimensions of the beam 16 from the laser source 54 may be in the range of 3 mm×5 mm to 5 mm×15 mm. The scanning optics 48 focuses beam 16 so that at distance H above the surface 2 of the workpiece 4, the final beam gives the appearance of a knife-edge. In particular, the laser beam 16 can predominantly comprise a single wavelength of ultraviolet light, and such wavelength can be chosen to interact with a specific constituent of the input gas 10.

A beam dump 63 (FIG. 2) with a surface that strongly absorbs radiant energy in the range 157–250 nm (e.g., a block of hard-anodized aluminum with a row of narrow vanes oriented in the direction of the reflected laser beam) is mounted inside the chamber 22. The beam dump 63 receives radiant energy reflected from the surface 2 of the workpiece 4 during processing. Additionally, a diagnostic laser beam 64 from a helium-neon laser 66 may be introduced into the chamber 22 through the scanning optics 48, and/or through the window 60. A monitor 68 could then be configured to receive a reflected diagnostic beam 64 to verify that the surface 2 has been treated without having to remove the workpiece 4 from the chamber 22 (e.g., by interferometric or light scattering techniques well-known in the field of surface analysis).

The translation stage 42 can comprise components for the temperature control of workpiece 4 during processing. Such components can include one or both of heating and cooling components 70 to maintain the workpiece 4 at a desired temperature. Additionally, the translation stage 42 may include various sensors that monitor pressure 72, temperature 74, and gases 76 in the chamber 22.

For purposes of controlling the surface treatment sequence, the controller 44 produces the necessary signals to operate processing system 20 in accordance with the present invention.

FIG. 2 shows a block diagram of the controller 44. The controller 44 includes a programmable central processing unit (CPU) 202 that is operable with a memory 204, a mass storage device 206, an input control unit 208, and a display unit 210. However, those skilled in the art will realize that it would be a matter of routine skill to select an appropriate computer system to control processing system 20. Additionally, those of skill in the art will also realize that the invention could be implemented using hardware such as an application specific integrated circuit (ASIC) or other hardware circuitry. As such, it should be understood that the invention could be implemented, in whole or in part, in software, hardware or both.

The controller 44 further includes well-known support circuits 214 such as power supplies 216, clocks 218, cache 220, input/output (I/O) circuits 222 and the like. The I/O circuit is connected to a control system bus 212. The bus 212 couples to the controller 44 the in-line flow regulators 30*a* and 30*b*, gas values 32*a* and 32*b*, mass flow meters 34*a* and 34*b*, exhaust pumps 38*a* and 38*b*, exhaust valves 40*a* and 40*b*, translation stage 42, laser controller 52, heating and cooling components 70, chamber sensors 72, 74, and 76, and a chamber door 78. Optionally, an electrically driven mechanical arm 80, which moves the workpiece 4 in and out of the chamber 22 through the chamber door 78 to and from a transport device/chamber 82, may be also controlled by the controller 44.

Other elements controlled by the controller 44 may include the following: mixing chambers 36*a* and 36*b* for mixing different gases, and if used, transition motors (not shown) for the dispenser unit 8 and scanning optics 48. It is to be appreciated that the system controller 44 provides signals to the chamber elements to cause these elements to perform operations for forming the reactive gas species in the subject apparatus to accomplish atomic layer deposition, and other semi-conductor processing, if desired.

The memory 204 contains instructions that the CPU 202 executes to facilitate the performance of the processing system 20. The instructions in the memory 204 are in the form of program code such as a program 300 (FIG. 4) that implements the method of the present invention. The program code may conform to any one of a number of different programming languages. For example, the program code can be written in C, C++, BASIC, Pascal, or a number of other languages.

The mass storage device 206 stores data and instructions and retrieves data and program code instructions from a processor-readable storage medium, such as a magnetic disk or magnetic tape. For example, the mass storage device 206 can be a hard disk drive, floppy disk drive, tape drive, or optical disk drive. The mass storage device 206 stores and retrieves the instructions in response to directions that it receives from the CPU 202. Data and program code instructions that are stored and retrieved by the mass storage device 206 are employed by the processor unit 202 for operating the processing system 20. The data and program code instructions are first retrieved by the mass storage device 206 from a medium and then transferred to the memory 204 for use by the CPU 202.

The input control unit 208 couples a data input device, such as a keyboard, mouse, or light pen, to the processor unit 202 to provide for the receipt of a chamber operator's inputs. The display unit 210 provides information to a chamber operator in the form of graphical displays and alphanumeric characters under control of the CPU 202.

The control system bus 212 provides for the transfer of data and control signals between all of the devices that are coupled to the control system bus 212. Although the control system bus 212 is displayed as a single bus that directly connects the devices in the CPU 202, the control system bus 212 can also be a collection of buses. For example, the display unit 210 input control unit 208 and mass storage device 206 can be coupled to an input-output peripheral bus, while the CPU 202 and memory 204 are coupled to a local processor bus. The local processor bus and input-output peripheral bus are coupled to form the control system bus 212.

Operation

Figure 4:
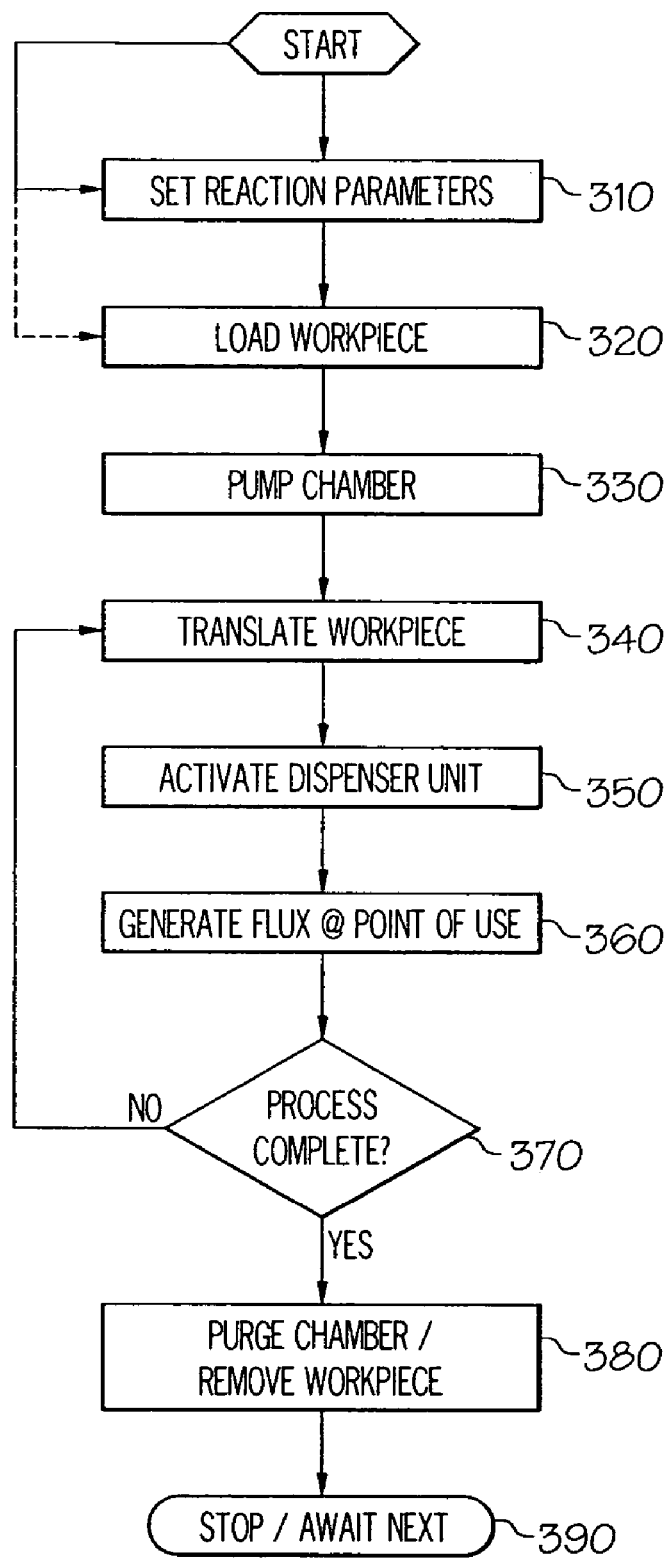
FIG. 4 is a process flow chart of a program which implements an embodiment of the atomic layer deposition method according to the present invention.

Reference is also made to FIG. 4, which is a process flow chart of the program 300 that implements the ALD methodology according to the present invention. Prior to ALD processing, in step 310 an appropriate set of reaction parameters are selected for use by the controller 44. Such reaction parameters include, for example but are not limited to: energy wavelength, energy density of the incident laser beam, gas composition, pressure and mass flow rates of precursor gas 5, input gas 10, purge gas 14, and optionally, transmission gas 12 inside the reaction chamber 22, stage translation rate, and temperature of workpiece 4.

Once the reaction parameters are selected, the workpiece 4 in step 320 is loaded into the chamber 16 through door 78, preferably from the transport device/chamber 82, and positioned on the wafer chuck 24 against banking pins 46, preferably by mechanical arm 80, with the surface 2 to be treated facing up. The order of selecting reaction parameters in step 310 and loading in step 320 is non-critical, and may be completed in any order or simultaneously.

In step 330, mechanical pump 38a pumps on the chamber 22 until a pressure of between about 1 and about 10 Torr is achieved. Next, in step 340 the stage 42 translates the chuck 24 and workpiece 4 at a constant rate across the chamber 22 from a rear end 84 to a forward end 86 (FIG. 2). When portion of the surface 2 of the workpiece is at its proper position for processing, in step 350 the controller 44 electrically activates gas values 30a and 30b and flow regulators 32a and 32b (in proper sequence). The controller 44 coordinates the delivery of precursor gas 5, input gas 10, and optionally transmission gas 12 (FIG. 1) from gas cylinders 28a and 28b through the dispenser unit 8 according to the selected reaction parameters. Additionally, in this step, the controller 44 coordinates the delivery of purge gas 14, and the pumping on evacuation ports 12a and 12b by pump 38b to prevent mixing of the precursor gas 5 and input gas 10 flows.

In step 360, the controller 44 coordinates with the laser controller 52 to deliver the laser beam 16 into the input gas flow 10. It is to be appreciated that controller 44 may be programmed to process the entire surface of the workpiece or a targeted portion. In either case, the controller 44 provides for the delivery of the laser beam 16 according to the selected reaction parameters such that the high flux of point of use reactive gas species B is generated at the proper time to react with surface reactant A at the selected locations of the surface 2 of the workpiece 4. In most cases, the controller 44 will delay the generation of the high flux of point of use reactive gas species B until reactant A is translated into its proper position for such interaction with gas species B.

In step 370, the controller 44 checks the formation of material monolayer S on the surface 2 of the workpiece 4. Such as, for example, if a desired layer thickness or quality is not detected by monitor 68, the above deposition processes may be repeated without removing the workpiece 4 from the reaction chamber 22. If the above ALD process is completed, the gas valves 20a and 20b are closed, the chamber 22 is purged in a conventional manner, and the workpiece 4 is then removed from the chamber 22 in step 380 to await a next workpiece 4 for processing in step 390.

In addition to the above-described ALD process, in certain situations it is may be desirous to chemically work the surface 2 of the workpiece 4 with only the generated reactive gas species B before or after such ALD processing. Examples of such chemical treatments include, but not limited to, etching, cleaning, removing photoresist, and other applications which will be apparent to those of skill in the art given the teachings herein. Depending on the kind of processing the workpiece 4 is subjected to prior to being treated in chamber 22, and/or the type of post-processing the workpiece 4 is to undergo, the surface 2 of the workpiece 4 may be treated as many times as required without being removed from the chamber 16, and if desired, under different reaction conditions.

It is to be appreciated that the above described method and apparatus of the present invention increases ALD production rates. The increase in production rates results from permitting the working of the surface 2 of the workpiece 4 with the high flux of a point of use generated reactive gas species while ahead of forming a surface reactant with a flow of a precursor gas without the need to completely purge or evacuate the entire reaction chamber.

Additionally, the present invention makes it possible to use two or more dispenser units to further increase the ALD process. In a multiple dispenser unit arrangement, for each additional radiation beam another dispenser unit is provided, such as is illustrated by secondary dispenser unit 8' and additionally radiation beam 16' in FIG. 2. Since the function of the secondary dispenser unit 8' and beam 16' are the same as dispenser unit 8 and beam 16 as described above, for brevity, no further discussion is provided as one skilled in the art would understand the use and benefit of such an arrangement.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents. Any modification of the present invention which comes within the spirit and scope of the following claims should be considered part of the present invention.

What is claimed is:

1. An apparatus for chemically treating a surface of a workpiece comprising:
    a supply of an input gas;
    a supply of a precursor gas;
    a supply of a purge gas;
    a dispenser unit adapted to expose the surface of the workpiece to a direct flow of said precursor gas for a surface reactant formation, to provide a flow of said input gas over the workpiece in a direction away from said precursor gas, and to provide said purge gas between said precursor gas and said input gas to prevent mixing of said precursor and input gases, said dispenser unit further having a pair of evacuation ports for evacuating said purge gas; and
    a source having optics which converge a beam of electromagnetic radiation in said flow of said input gas in close proximity to the surface of the workpiece, but spaced a finite distance therefrom, to dissociate said input gas into a high flux of generated reactive gas species that reacts with said surface reactant to chemically treat said surface of said workpiece.

2. The apparatus of claim 1, further comprising a flow of a transmission gas provided over said flow of said input gas, said transmission gas being substantially nonattenuating to preselected wavelengths of said electromagnetic radiation.

3. The apparatus of claim 1 further comprising a structure for causing relative motion between the surface of the workpiece, said dispenser unit, and said beam.

4. The apparatus of claim 1 further comprising a chamber for containing said workpiece and said gases during said processing, said chamber having a window transparent to said electromagnetic radiation.

5. The apparatus of claim 4 wherein said chamber further includes a workpiece temperature sensor for measuring the temperature of the workpiece during processing; a pressure sensor for measuring the gas pressures in the chamber during processing, and a gas sensor for monitoring at least said generated reactive gas species.

6. The apparatus of claim 1 wherein said electromagnetic radiation is ultraviolet radiation.

7. The apparatus of claim 1 further comprising optics to focus said beam.

8. The apparatus of claim 1, wherein said optics further expand a cross sectional dimension of said beam into a wide scanning beam.

9. The apparatus of claim 1 wherein said finite distance is less than a few mean-free-path lengths of said generated reactive gas species.

10. The apparatus of claim 1 wherein said chamber further comprising a pair of exhaust pump for pumping on said evacuation ports and for exhausting gases from said chamber.

11. The apparatus of claim 1 wherein said dispenser unit includes a nozzle connected to said supply of input gas to provide a laminar flow across the surface of the workpiece.

12. The apparatus of claim 1 wherein said chamber further comprises heating and cooling components.

13. The apparatus of claim 1 further comprising at least one mixing chamber.

14. The apparatus of claim 1 further comprising a controller adapted to control said chemical treatment according to a selected set of reaction parameters.

15. The apparatus of claim 1 further comprising a monitor adapted to monitor completion of said chemical treatment.

16. The apparatus of claim 1 further comprising a beam dump adapted to absorb reflected energy of said beam.

17. The apparatus of claim 1 wherein said dispenser unit is one of a plurality of dispenser unit and said beam is one of a plurality of beams.

* * * * *